United States Patent
Yashiro

(10) Patent No.: US 7,761,017 B2
(45) Date of Patent: Jul. 20, 2010

(54) POWER SUPPLY APPARATUS AND IMAGE FORMING APPARATUS

(75) Inventor: Akira Yashiro, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 416 days.

(21) Appl. No.: 11/987,435

(22) Filed: Nov. 30, 2007

(65) Prior Publication Data
US 2008/0138099 A1    Jun. 12, 2008

(30) Foreign Application Priority Data
Dec. 11, 2006    (JP) .............................. 2006-333506

(51) Int. Cl.
*G03G 15/00* (2006.01)
(52) U.S. Cl. .......................... 399/37; 399/44
(58) Field of Classification Search .................. 399/37, 399/44, 88; 324/771
See application file for complete search history.

(56) References Cited

U.S. PATENT DOCUMENTS

| | | | | |
|---|---|---|---|---|
| 5,114,442 A | * | 5/1992 | Artz | ............................... 96/19 |
| 5,633,704 A | * | 5/1997 | Suzuki et al. | .................. 399/69 |
| 5,783,806 A | * | 7/1998 | Hayasaki | ..................... 219/635 |
| 6,104,088 A | | 8/2000 | Hatano et al. | |
| 6,862,192 B2 | | 3/2005 | Yashiro | |
| 2005/0121228 A1 | | 6/2005 | Yashiro | |
| 2005/0127520 A1 | | 6/2005 | Yashiro | |

FOREIGN PATENT DOCUMENTS

| | | |
|---|---|---|
| JP | 2002-287575 | 10/2002 |
| JP | 2003-057889 | 2/2003 |

* cited by examiner

*Primary Examiner*—David P Porta
*Assistant Examiner*—Marcus H Taningco
(74) *Attorney, Agent, or Firm*—IPUSA, PLLC

(57) ABSTRACT

A power supply apparatus includes an error detecting unit configured to perform error detection to detect that an output node and another node are placed in a short-circuit state or open-circuit state, a condition change detecting unit configured to detect a change in an external condition, and an operating-point changing unit configured to change an operating point of the error detection performed by the error detecting unit in response to the change detected by the condition change detecting unit.

10 Claims, 11 Drawing Sheets

POWER SUPPLY APPARATUS AND IMAGE FORMING APPARATUS

BACKGROUND OF THE INVENTION

1. Field of the Invention

The present invention generally relates to a power supply device and an image forming apparatus provided with a power supply device. The present invention particularly relates to a power supply device that detects error when its output and another node are placed in the short-circuit state or open-circuit state, and also relates to an image forming apparatus provided with such a power supply device.

2. Description of the Related Art

It is widely practiced to provide a power supply device with an error detecting unit for detecting an event in which its power supply output node and another node such as a ground node are placed in the short-circuit state or open-circuit state. When the load impedance coupled to the output node exhibits a large change due to a change in external environments such as temperature and/or humidity, however, a given circuit structure may not be able to detect the short-circuit state or open-circuit state correctly.

FIG. 11 is a drawing showing a related-art power supply circuit for the purpose of showing an example of a failure to correctly detect a short-circuit state. The power supply circuit includes transistors Q1 and Q2, capacitors C1 through C4, resistors R1 through R5, and transformers 1 and 2. A resistance load 4 is coupled to an output node 3 of the power supply circuit.

In this circuit, the transformers 1 and 2 produce a positive potential and a negative potential, and a power supply voltage is output from the output node 3. A resistor 5 (R3) is provided along an output path extending from the transformer 1 to the resistance load 4. When the impedance of the load 4 becomes significantly smaller than the resistance of the resistor 5, there will be only a slight change between a small load state and a short-circuit state. Because of this, it may not be possible to correctly detect an error.

In an image forming apparatus using an electrophotographic image forming process, an image formed on a photoconductor serving as an image holding member is transferred to an intermediate transfer belt, and is then transferred from the intermediate transfer belt to a paper sheet serving as a print medium. The impedance associated with the intermediate transfer belt tends to exhibit large fluctuations due to changes in temperature and/or humidity. An impedance under a high-temperature and high-humidity condition may exhibit a change by a factor of hundreds in comparison with the impedance under the normal office conditions. A measure to prevent erroneous error detection should thus be taken in such a case. In consideration of this, an arrangement may be made to provide a sensor such as a humidity sensor close to the intermediate transfer belt and to adjust a bias voltage in response to the detected humidity. Japanese Patent Application Publication No. 2003-57889, for example, discloses a technology for use in an image forming apparatus to adjust image forming process control and/or fusing process control in response to temperature and/or humidity conditions.

When a power supply device as previously described is employed in an image forming apparatus, it may be possible to detect a short-circuit state and open-circuit state under normal conditions. It may not be possible, however, to correctly detect a short-circuit state and open-circuit state when a load impedance in the image forming apparatus is changed due to a change in external conditions such as temperature and humidity.

Accordingly, there is a need for a power supply device that can correctly detect a short-circuit state and open-circuit state even when a load impedance is changed due to a change in external conditions such as temperature and humidity.

SUMMARY OF THE INVENTION

It is a general object of at least one embodiment of the present invention to provide a power supply apparatus and image forming apparatus that substantially eliminate one or more problems that may be caused by the limitations and disadvantages of the related art.

According to at least one embodiment of the present invention, a power supply apparatus includes an error detecting unit configured to perform error detection to detect that an output node and another node are placed in a short-circuit state or open-circuit state, a condition change detecting unit configured to detect a change in an external condition, and an operating-point changing unit configured to change an operating point of the error detection performed by the error detecting unit in response to the change detected by the condition change detecting unit.

According to at least one embodiment of the present invention, an image forming apparatus includes a power supply unit and a control unit operating based on a power supplied from the power supply unit to control an image forming operation, wherein the power supply unit includes an error detecting unit configured to perform error detection to detect that an output node and another node are placed in a short-circuit state or open-circuit state, a condition change detecting unit configured to detect a change in an external condition, and an operating-point changing unit configured to change an operating point of the error detection performed by the error detecting unit in response to the change detected by the condition change detecting unit.

According to at least one embodiment of the present invention, error detection is performed under an ideal condition taking into account temperature and/or humidity conditions even when the load impedance coupled to the power supply device is significantly changed due to an environmental factor.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings. In these embodiments, the same elements will be referred to by the same numerals, and a duplicate description will be omitted.

Figure 1:
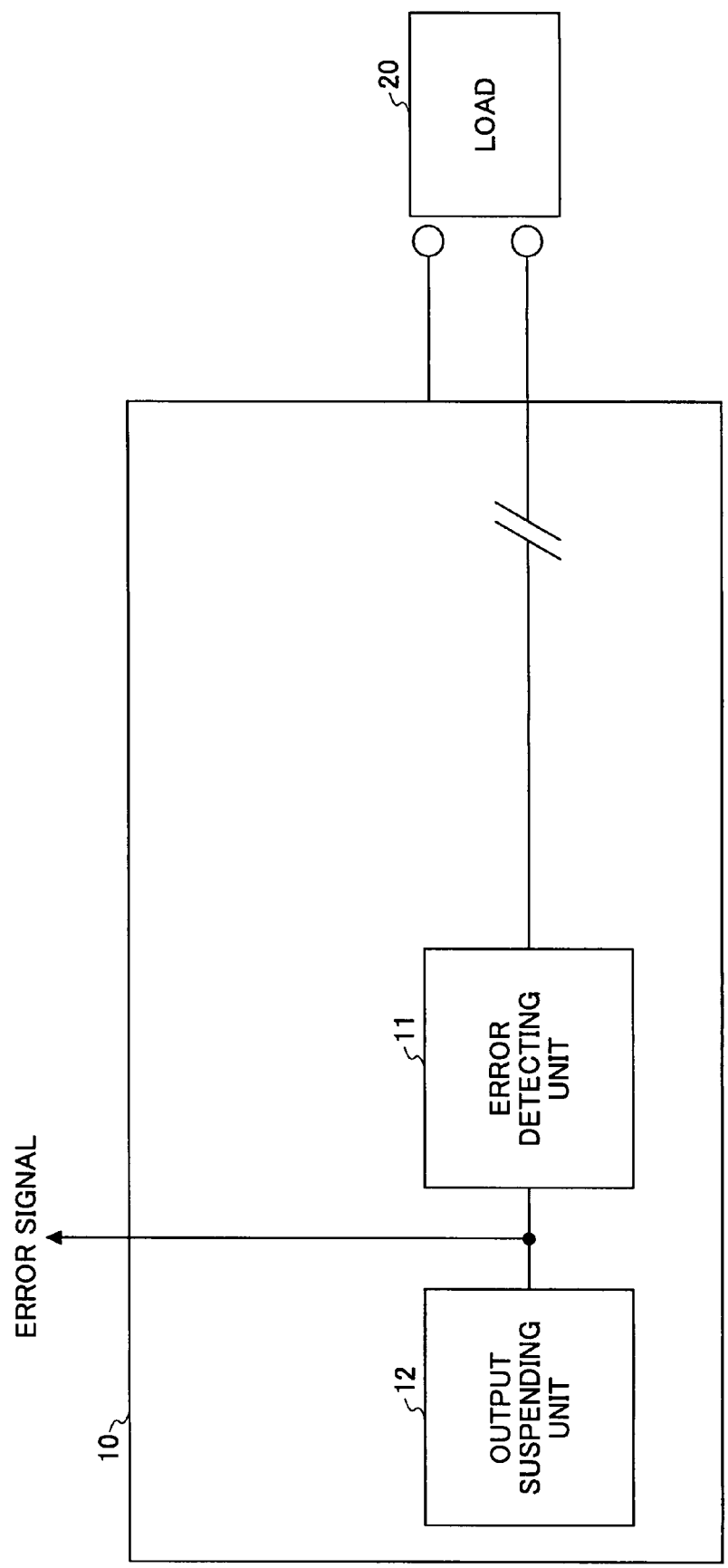
FIG. 1 is a block diagram showing a basic configuration of a power supply device according to an embodiment of the present invention.

FIG. 1 is a block diagram showing a basic configuration of a power supply device according to an embodiment of the present invention. The basic configuration of the power supply device 10 includes an error detecting unit 11 for detecting a short-circuit state and/or open-circuit state between the output node of the power supply device 10 and another node such as a ground node, and further includes an output suspending unit 12 for forcibly suspending the outputting of the power supply device in response to an error signal supplied from the error detecting unit 11. A load 20 operates based on the output of the power supply device 10.

Figure 11:
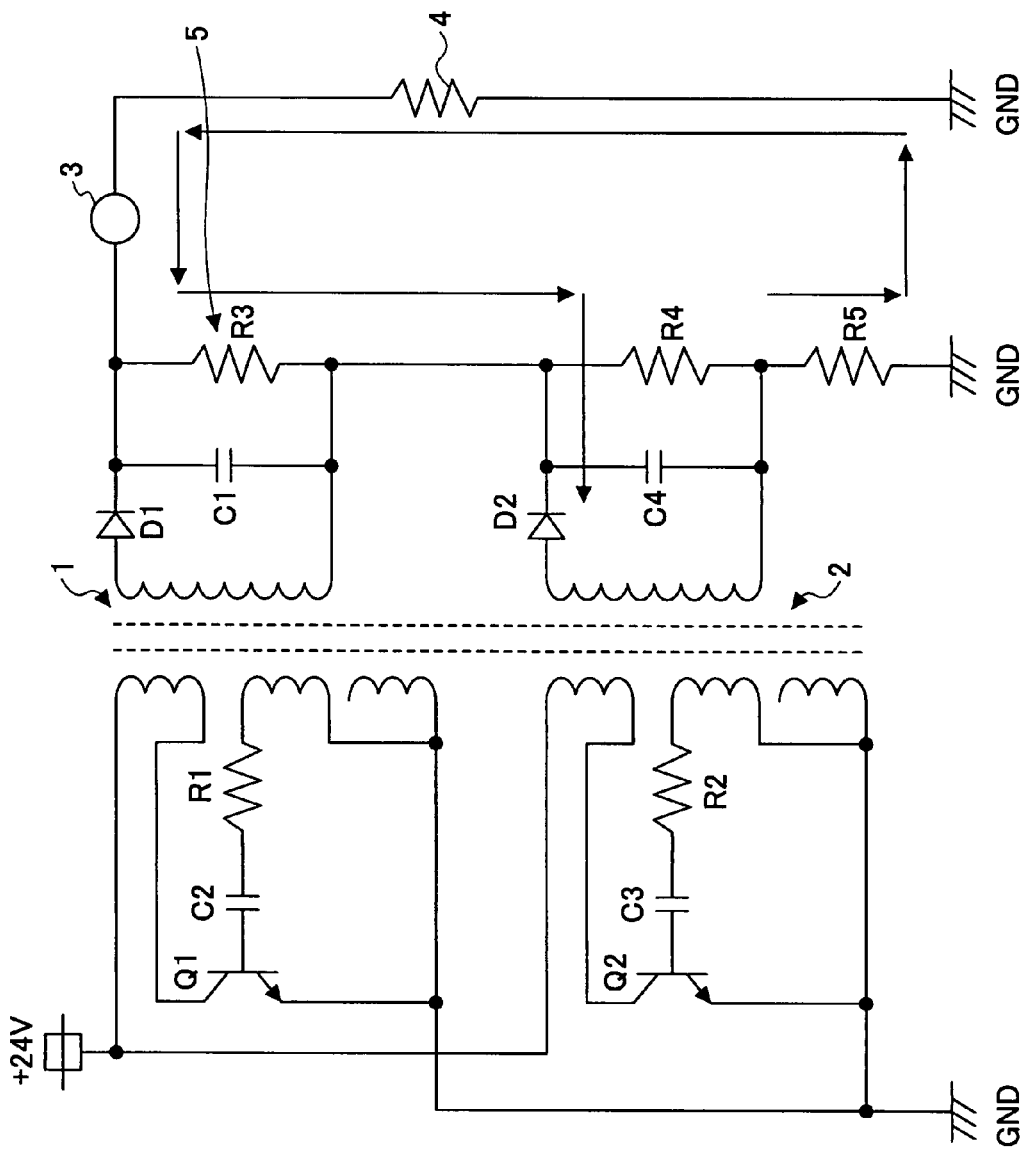
FIG. 11 is a drawing showing a related-art power supply circuit for the purpose of showing an example of a failure to correctly detect a short-circuit state.

The error detecting unit 11 receives a detection signal indicative of either a voltage level or a current amount associated with the output node. If the power supply device 10 utilizes a circuit structure as shown in FIG. 11, the detection signal may indicate a voltage level detected at the output node 3, or may indicate a current amount detected as passing through the resistor R5. The error detecting unit 11 compares the detection signal with a predetermined error detection threshold to detect a short-circuit state or open-circuit state.

Figure 2:
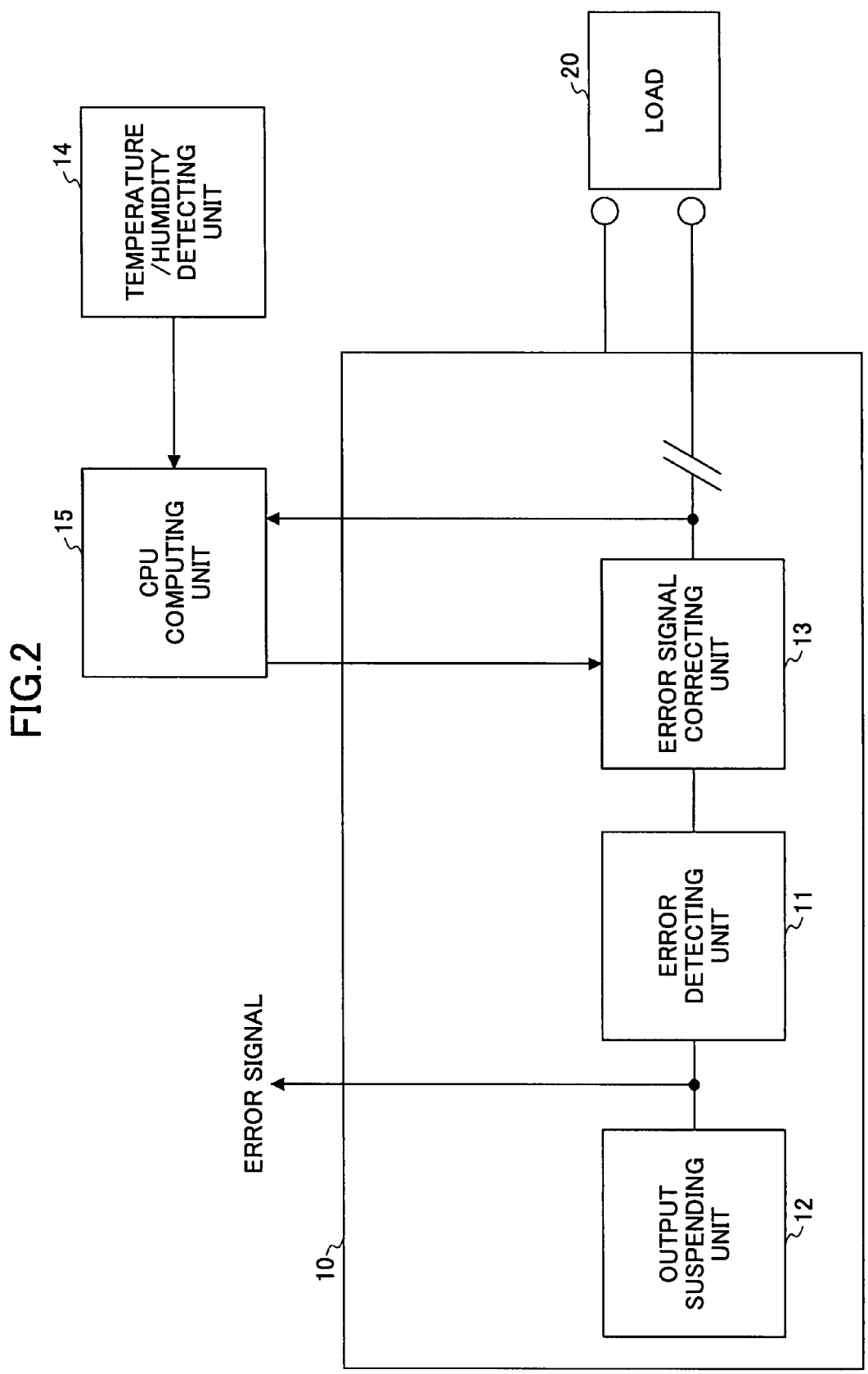
FIG. 2 is a block diagram showing the configuration of a power supply apparatus according to a first embodiment of the present invention.

FIG. 2 is a block diagram showing a power supply apparatus according to a first embodiment of the present invention. The power supply apparatus according to the first embodiment includes an error signal correcting unit 13 situated between the error detecting unit 11 and the output node in addition to the basic configuration of the power supply device 10 shown in FIG. 1. The error signal correcting unit 13 receives the detection signal, and outputs a corrected detection signal that is input into the error detecting unit 11.

The power supply apparatus further includes a temperature/humidity detecting unit 14 for detecting an external condition such as ambient temperature and/or humidity and a CPU computing unit 15 for comparing a predetermined reference value with a temperature and/or humidity detected by the temperature/humidity detecting unit 14. The CPU computing unit 15 serves to perform the computation necessary for the comparison operation. The CPU computing unit 15 compares a predetermined reference value with a temperature and/or humidity detected by the temperature/humidity detecting unit 14, and causes the error signal correcting unit 13 in response to the outcome of the comparison to correct a detection signal that is input into the error detecting unit 11. With this arrangement, it is possible to perform error detection under a condition equivalent to an ideal temperature and/or humidity condition even when the impedance of the load 20 is changed due to a temperature and/or humidity change.

The correction of the detection signal may be achieved by changing the signal level of the detection signal so as to change the voltage level or current amount represented by the detection signal. Because the corrected detection signal is compared with the error detection threshold by the error detecting unit 11, the correction of the detection signal is equivalent to a change in the error detection threshold. That is, a magnitude relation between the detection signal and the error detection threshold is changed by the error signal correcting unit 13, such that the correction of the detection signal affects a determination as to which one of the detection signal and the error detection threshold is greater. In other words, the operating point of error detection is changed by the correction of the detection signal.

Relationships between the value of a detection signal under the ideal temperature and/or humidity condition and the values of the detection signal under varying temperature and/or humidity conditions may be organized as data in a table, which may then be used for the correction operation performed by the CPU computing unit 15. This is an effective measure. It is even more effective to provide an arrangement in which an output setting of the power supply output is changed. The use of this power supply apparatus is advantageous when it is mounted in an apparatus having a large impedance variation in respect of the load 20, such as an electrophotographic image forming apparatus.

Figure 3:
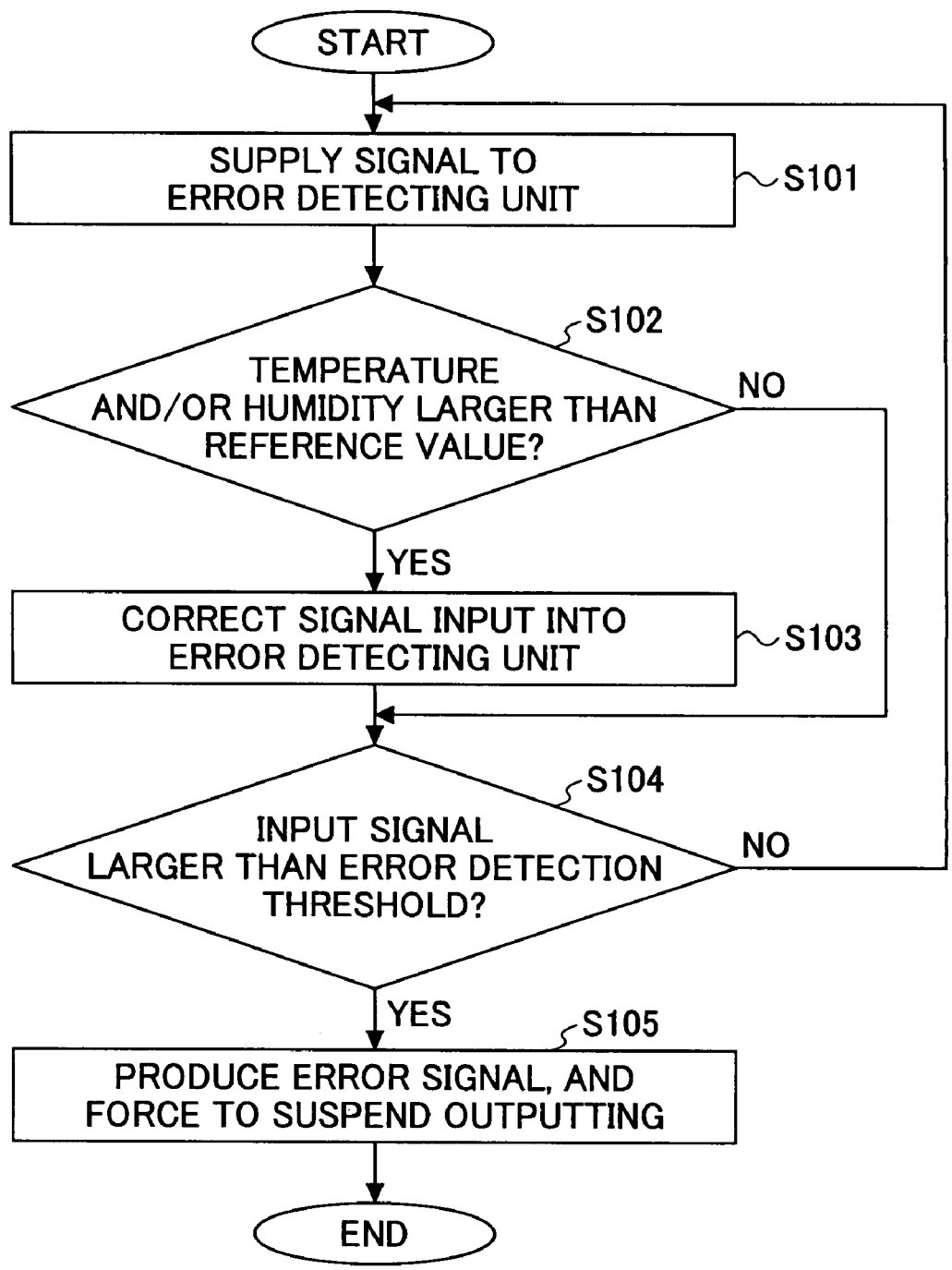
FIG. 3 is a flowchart showing a procedure for changing an operating point of error detection according to the first embodiment.

FIG. 3 is a flowchart showing a procedure performed by the CPU computing unit 15 for changing an operating point of error detection according to the first embodiment. In this procedure, first, a detection signal is input into the error detecting unit 11 (step S101). Then, the CPU computing unit 15 checks whether the temperature and/or humidity detected by the temperature/humidity detecting unit 14 is larger than a predetermined reference value (step S102). The error signal correcting unit 13 corrects the detection signal input into the error detecting unit 11 if the detected temperature/humidity value is larger than the predetermined reference value (step S103), and the error detecting unit 11 checks whether the corrected detection signal is larger than an error detection threshold (step S104). If it is ascertained in step S102 that the detected temperature/humidity value is no larger than the predetermined reference value, the procedure proceeds to step S104 by skipping step S103. In step S104, the error detecting unit 11 compares the error detection threshold either with the detection signal input into the error detecting unit 11 that is not corrected by skipping step S103 or with the corrected detection signal input into the error detecting unit 11 that is corrected in step S103. The error detecting unit 11 asserts an error signal if the input detection signal exceeds the threshold, thereby forcing a suspension of power from the power supply device by use of the output suspending unit 12. If the input detection signal does not exceed the threshold, the procedure returns to step S101, from which the subsequent steps are repeated.

Figure 4:
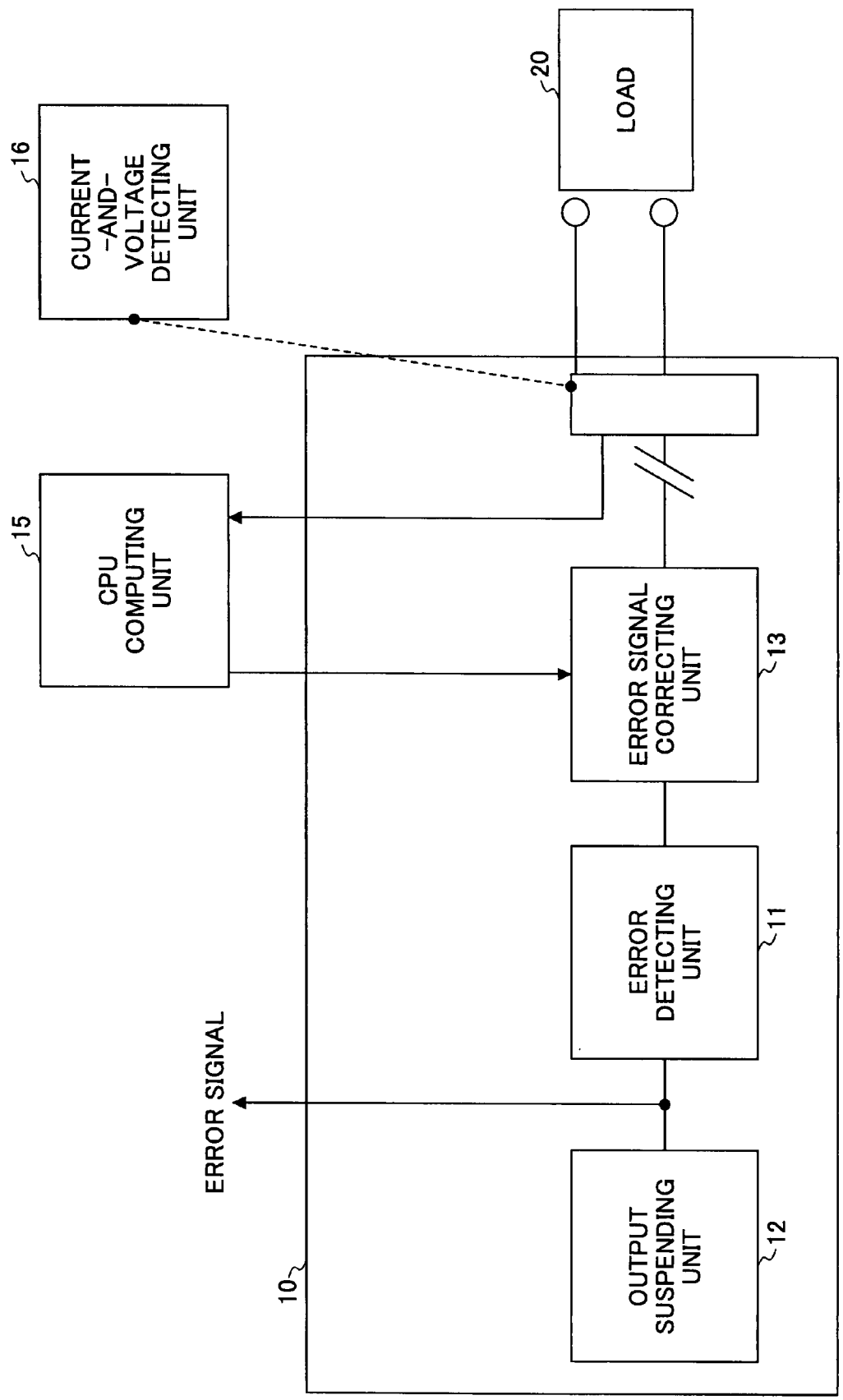
FIG. 4 is a block diagram showing the configuration of a power supply apparatus according to a second embodiment of the present invention.

FIG. 4 is a block diagram showing the configuration of a power supply apparatus according to a second embodiment of the present invention. In the second embodiment, an impedance is derived from the current and voltage applied to the load 20, and the operating point of error detection is changed based on the temperature and/or humidity estimated from the derived impedance.

In this embodiment, the temperature/humidity detecting unit 14 used in the first embodiment shown in FIG. 2 is removed, and a current-and-voltage detecting unit 16 is provided between the error signal correcting unit 13 and the load 20. The current-and-voltage detecting unit 16 detects the current and voltage applied to the load 20, and is operable to transmit the detected values to the CPU computing unit 15. The CPU computing unit 15 has temperature and/or humidity stored beforehand in memory that are estimated based on impedance values derived from the current values and voltage values. Provision can thus be made such that the operating point of error detection is changed based on the temperature and/or humidity estimated from the derived impedance when the impedance is derived from the current and voltage applied to the load 20. Accordingly, it is possible to perform error detection under a condition equivalent to an ideal temperature and/or humidity condition even when the impedance of the load 20 is changed due to a temperature and/or humidity change.

Figure 5:
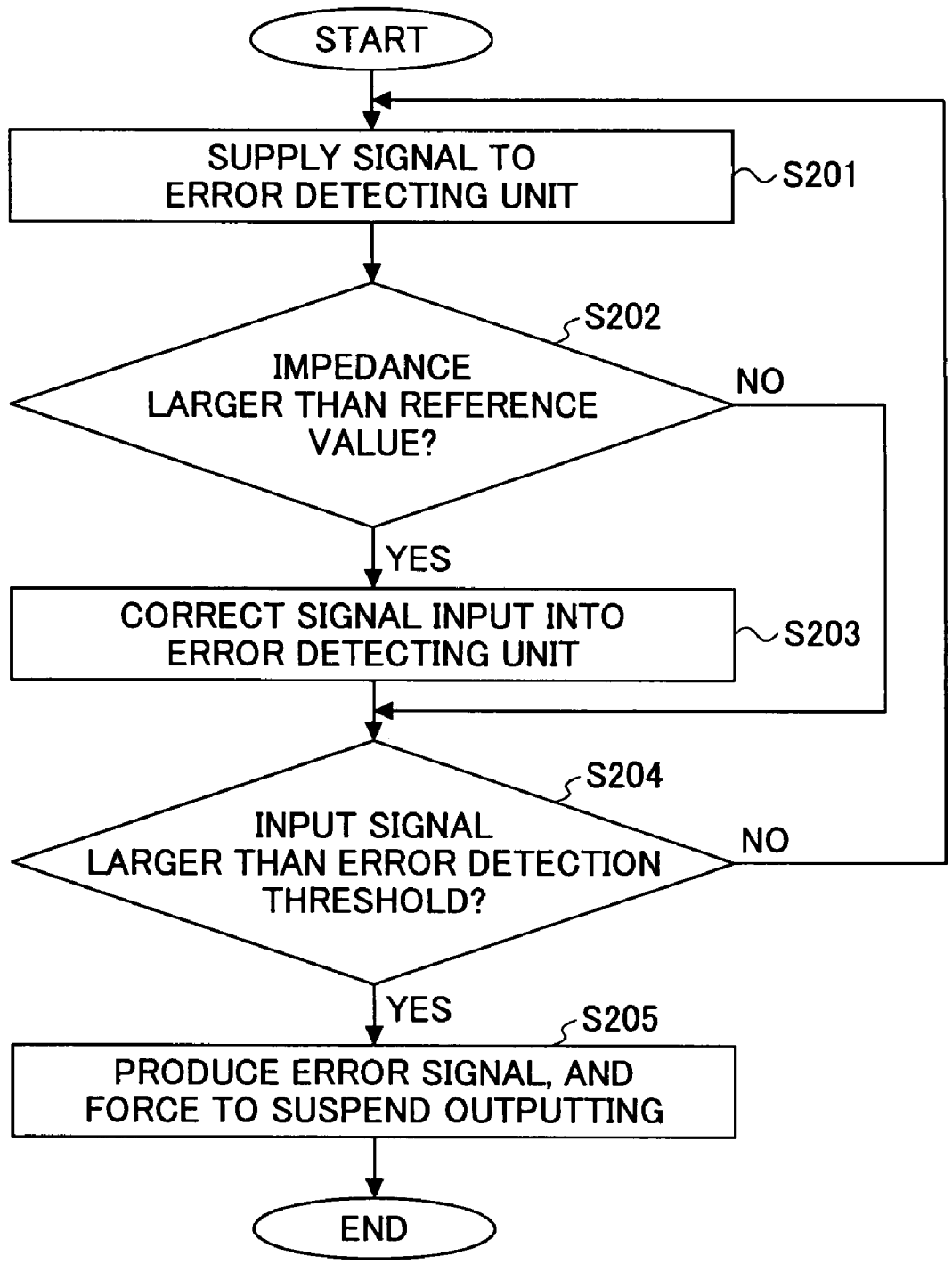
FIG. 5 is a flowchart showing a procedure for changing an operating point of error detection according to the second embodiment.

FIG. 5 is a flowchart showing a procedure for changing an operating point of error detection according to the second embodiment. A detection signal is input into the error detecting unit 11 (step S201), and the CPU computing unit 15 checks whether the impedance is larger than a predetermined reference value (step S202). The error signal correcting unit 13 corrects the detected signal input into the error detecting unit 11 if the detected impedance value is larger than the predetermined reference value (step S203), and the error detecting unit 11 checks whether the corrected detection signal is larger than an error detection threshold (step S204). If it is ascertained in step S202 that the detected impedance value is no larger than the predetermined reference value, the procedure proceeds to step S204 by skipping step S203. In step S204, the error detecting unit 11 compares the error detection threshold with either the detection signal input into the error detecting unit 11 that is not corrected by skipping step S203 or the corrected detection signal input into the error detecting unit 11 that is corrected in step S203. The error detecting unit 11 asserts an error signal if the input detection signal exceeds the threshold, thereby forcing a suspension of power from the power supply device by use of the output suspending unit 12. If the input detection signal does not exceed the threshold, the procedure returns to step S201, from which the subsequent steps are repeated.

Figure 6:
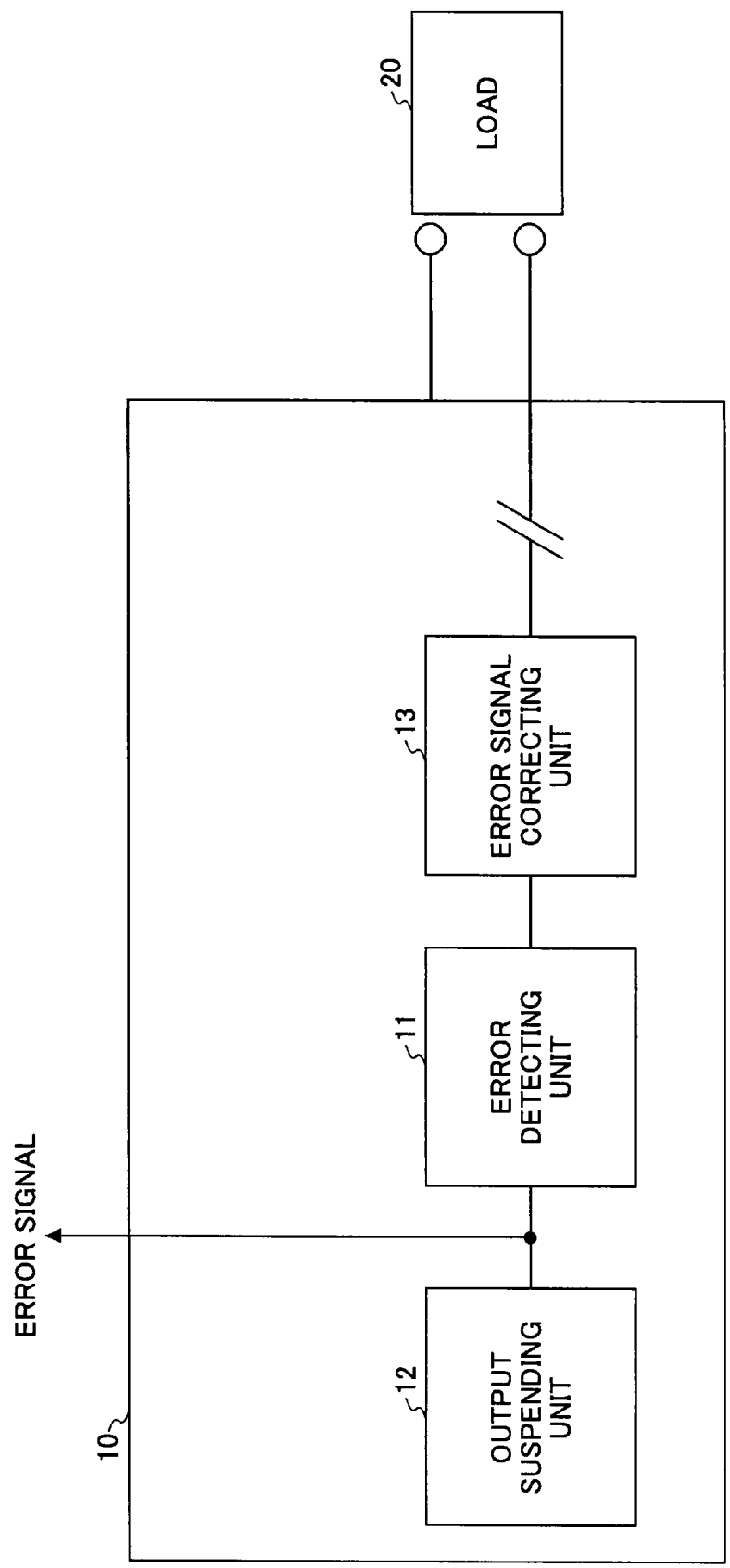
FIG. 6 is a block diagram showing the configuration of a power supply apparatus according to a third embodiment of the present invention.

FIG. 6 is a block diagram showing the configuration of a power supply apparatus according to a third embodiment of the present invention. In the third embodiment, a member whose resistance varies in response to a temperature and/or humidity change is used in the error signal correcting unit 13, thereby changing the operating point of error detection based on a change in this resistance. The power supply device 10 is configured such that the error signal correcting unit 13 is provided between the error detecting unit 11 and the load 20 in addition to the basic configuration shown in FIG. 1.

Figure 7:
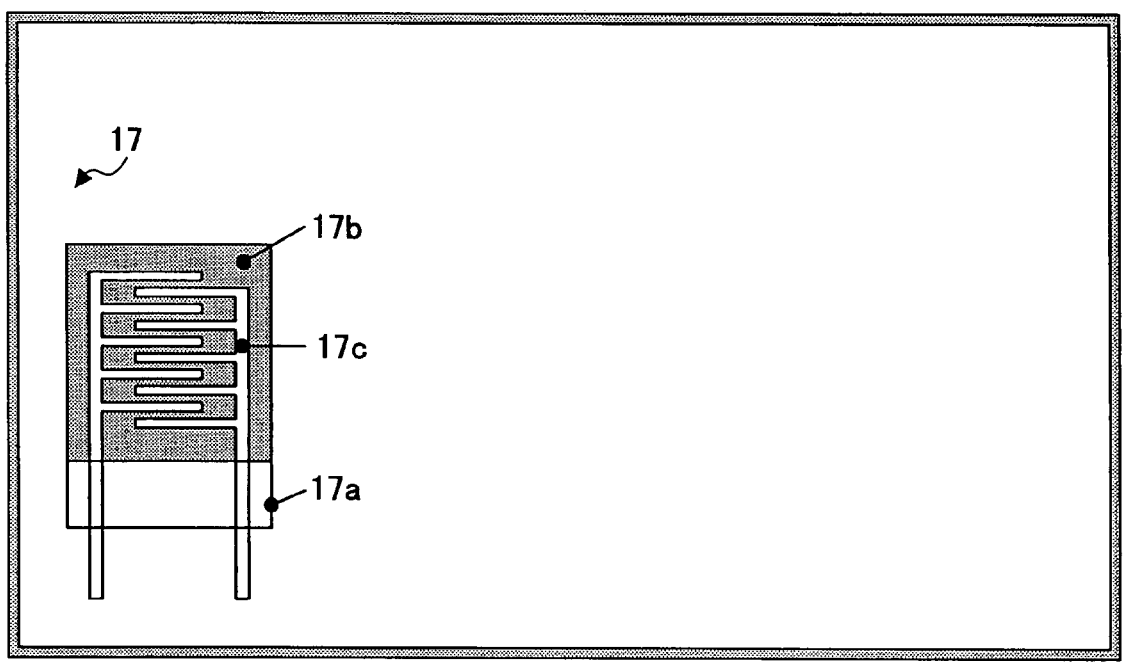
FIG. 7 is a drawing showing an example of a member whose resistance varies in response to a humidity change.

FIG. 7 is a drawing showing a member 17 whose resistance varies in response to a humidity change. The member 17 is configured such that a moisture sensitive material 17b made of high polymer is coated on a ceramic substrate 17a, with electrodes 17c made of gold plating or the like formed in a comb shape on the moisture sensitive material 17b. The resistance between the electrodes 17c varies in response to a humidity change. A member whose resistance varies in response to a temperature change includes a thermistor. Such a member whose resistance varies in response to a temperature and/or humidity condition is coupled to the error detecting unit 11, thereby canceling out a temperature/humidity-based change in the impedance of the load 20. It should be noted that the above-noted member whose resistance varies needs to have such resistance characteristics that cancel out a temperature/humidity-based impedance change of the load 20. In other words, the corrected detection signal output from the error signal correcting unit 13 is independent of a temperature/humidity change despite the fact that the detection signal input into the error signal correcting unit 13 varies in response to such a temperature/humidity change.

Figure 8:
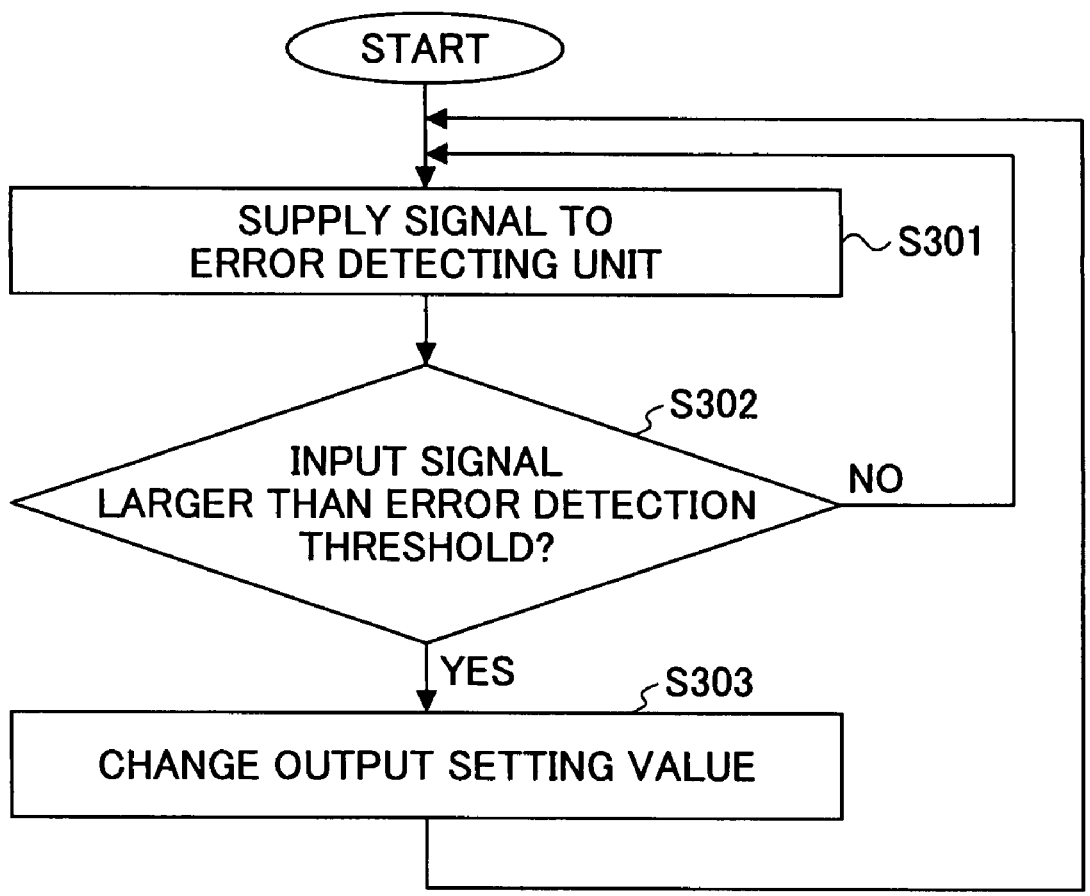
FIG. 8 is a flowchart showing a procedure for choosing a new output setting that is found by changing an output setting until no error is detected.

FIG. 8 is a flowchart showing a procedure for choosing a new output setting that is found by changing an output setting until no error is detected. A detection signal is input into the error detecting unit 11 (step S301). The CPU computing unit compares the detection signal with an error detection threshold (step S302), and changes an output setting regarding the output of the power supply device 10 until the detection signal drops below the error detection threshold (step S303). In this procedure, a new output setting may be obtained by adding a given value to a current output setting or by setting an output setting to zero. Changing the output setting to a non-zero setting makes it possible to avoid the suspension of power supply outputting due to an erroneous detection. This procedure is particularly effective when the power supply device is used in an environment that is outside the guaranteed operating conditions. It should be noted that the output from the power supply device to the load may be changed according to an instruction from the error signal correcting unit 13 to the CPU computing unit 15.

A change in the output setting as described above serves to change the voltage level or current amount represented by the detection signal. The operating range of the detection signal is thus changed by the change of the output setting, which results in a change in the operating range of error detection.

Figure 9:
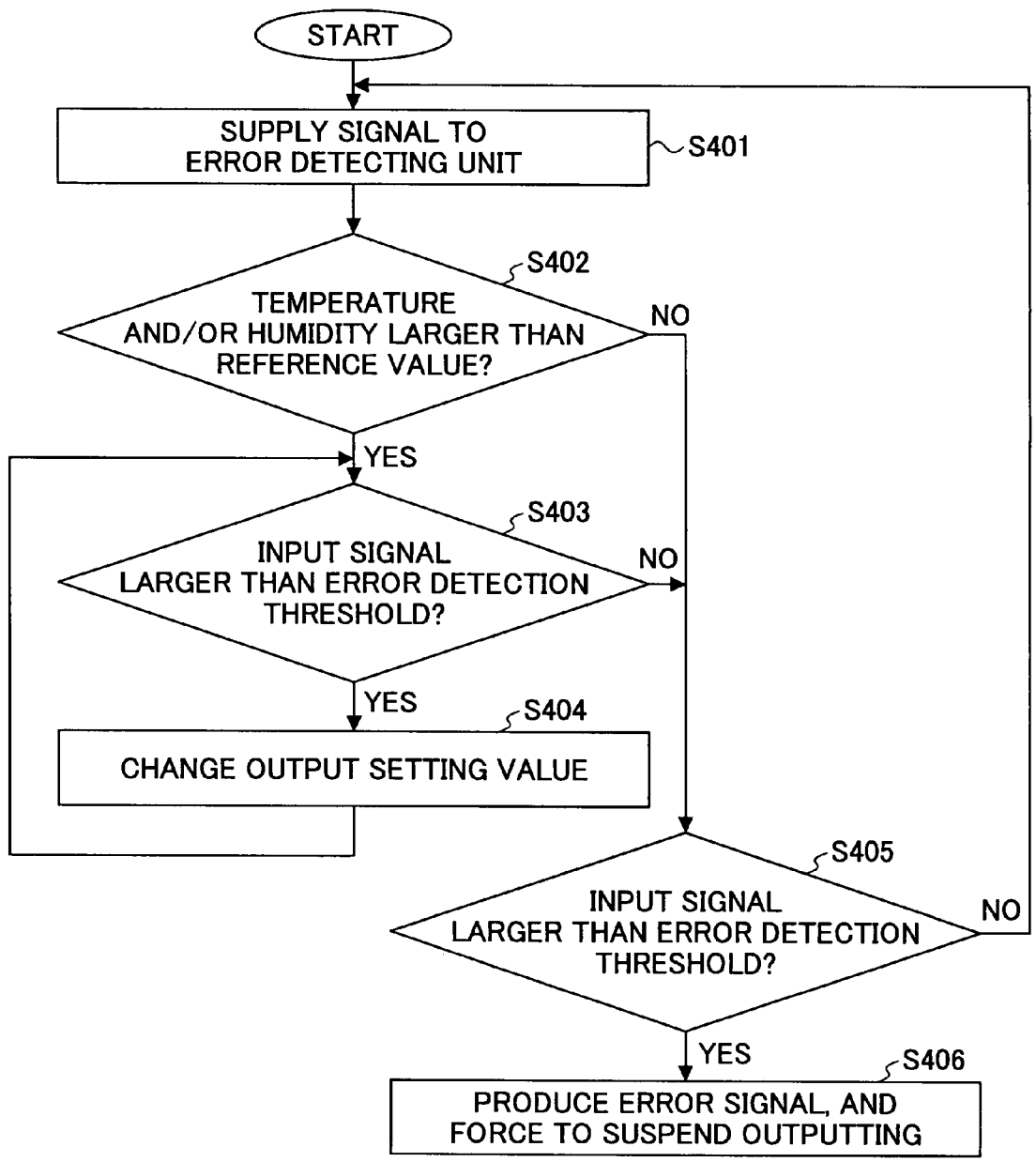
FIG. 9 is a flowchart showing another example of the procedure for choosing a new output setting that is found by changing an output setting until no error is detected.

FIG. 9 is a flowchart showing another example of the procedure for choosing a new output setting that is found by changing an output setting until no error is detected. In this example, the operating point of error detection is changed in response to an external condition. The procedure shown here is equivalent to one in which step S103 of FIG. 3 is replaced with step S403 and step S404. A detection signal is input into the error detecting unit 11 (step S401). Then, the CPU computing unit 15 checks whether the temperature and/or humidity detected by the temperature/humidity detecting unit 14 is larger than a predetermined reference value (step S402). The CPU computing unit 15 further compares the detection signal with an error detection threshold if the detected temperature and/or humidity is larger than a predetermined reference value (step S403). If the detection signal is larger than the error detection threshold, the CPU computing unit 15 changes an output setting until the detection signal becomes no larger than the error detection threshold (step S404). If it is ascertained in step S402 that the detected temperature and/or humidity is no larger than the predetermined reference value, or if it is ascertained in step S403 that the detection signal has dropped to be no larger than the threshold owing to the change of the output setting, the error detecting unit 11 compares its error detection threshold with the detection signal input into the error detecting unit 11 in step S405. The error detecting unit 11 asserts an error signal if the input detection signal exceeds the error detection threshold, thereby forcing a suspension of power from the power supply device by use of the output suspending unit 12 (step S406). If the input detection signal does not exceed the threshold, the procedure returns to step S401, from which the subsequent steps are performed.

Figure 10:
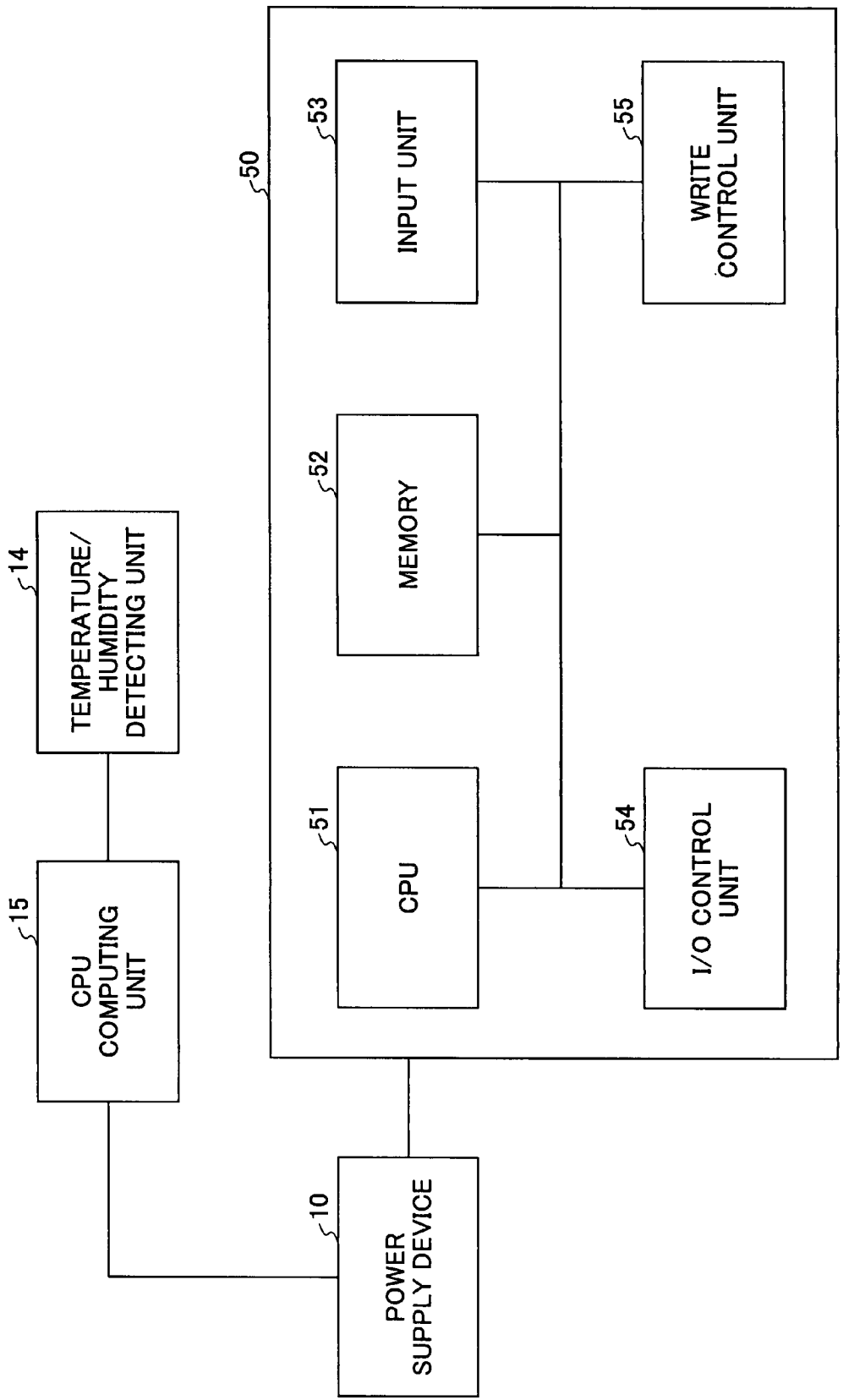
FIG. 10 is a block diagram showing a control unit of an image forming apparatus according to an embodiment of the present invention.

FIG. 10 is a block diagram showing the configuration of a control unit of an image forming apparatus provided with the power supply device 10. A control unit 50 receiving a power supply from the power supply device 10 includes a CPU 51, a memory 52, an input unit 53, an input/output (I/O) control unit 54, and a write control unit 55. The CPU 51 is implemented by use of a microcomputer or the like, and performs the overall control of the image forming apparatus. The CPU 51 may be the same CPU that is shown as the CPU computing unit 15. The memory 52 may include a ROM storing control programs, a RAM providing a work area for use in control operations, an NV-RAM storing various information necessary for control operations, etc. Relationships between the value of the detection signal under the ideal temperature and/or humidity condition and the values of the detection signal under varying temperature and/or humidity conditions may be organized as data in a table and stored in the memory 52. The input unit 53 receives image data from a personal computer, a scanner, or the like. The I/O control unit 54 controls various electrical components such as motors, solenoids, and the like. The write control unit 55 controls the writing of an image using a printer head, the movement of a carriage, and the charge/discharge of an intermediate transfer belt and the like. Operations to form an image are well-known in the art, and a description thereof will be omitted. The table that stores the relationships of the values of the detection signal responsive to temperature and/or humidity changes may be provided as an attachment to the CPU computing unit 15.

Further, the present invention is not limited to these embodiments, but various variations and modifications may be made without departing from the scope of the present invention.

The present application is based on Japanese priority application No. 2006-333506 filed on Dec. 11, 2006, with the Japanese Patent Office, the entire contents of which are hereby incorporated by reference.

What is claimed is:

1. A power supply apparatus, comprising:
an error detecting unit configured to perform error detection to detect that an output node and another node are placed in a short-circuit state or open-circuit state;
a condition change detecting unit configured to detect a change in an external condition; and
an operating-point changing unit configured to change an operating point of the error detection performed by the error detecting unit in response to the change detected by the condition change detecting unit.

2. The power supply apparatus as claimed in claim 1, wherein the condition change detecting unit is configured to detect at least one of ambient temperature and humidity.

3. The power supply apparatus as claimed in claim 2, wherein the condition change detecting unit is configured to detect a resistance change caused by at least one of ambient temperature and humidity.

4. The power supply apparatus as claimed in claim 1, wherein the condition change detecting unit includes an impedance detecting unit configured to estimate the external condition based on an impedance of a load coupled to the output node.

5. The power supply apparatus as claimed in claim 1, wherein the operating point changing unit is configured to change a threshold of a detection signal supplied to the error detecting unit, the error detecting unit performing the error detection in response to the detection signal.

6. The power supply apparatus as claimed in claim 5, wherein the threshold is changed by referring to a table stored in memory, the table listing detection signal values corresponding to changes in the external condition.

7. The power supply apparatus as claimed in claim 1, wherein the operating-point changing unit is configured to change a setting of a power supply output from the output node.

8. The power supply apparatus as claimed in claim 7, wherein the power supply output setting is set to zero.

9. The power supply apparatus as claimed in claim 7, wherein the power supply output setting is changed to a setting that is used when an absence of error is first detected upon changing the power supply output setting step by step.

10. An image forming apparatus, comprising:
a power supply unit; and
a control unit operating based on a power supplied from the power supply unit to control an image forming operation,
wherein the power supply unit includes:
an error detecting unit configured to perform error detection to detect that an output node and another node are placed in a short-circuit state or open-circuit state;
a condition change detecting unit configured to detect a change in an external condition; and
an operating-point changing unit configured to change an operating point of the error detection performed by the error detecting unit in response to the change detected by the condition change detecting unit.

* * * * *